US005379009A

United States Patent [19]

Ishikawa et al.

[11] Patent Number: 5,379,009

[45] Date of Patent: Jan. 3, 1995

[54] ACTIVE-TYPE BAND-PASS FILTER

[75] Inventors: Youhei Ishikawa; Seiji Hidaka, both of Nagaokakyo, Japan

[73] Assignee: Murata Manufacturing Co., Ltd., Kyoto, Japan

[21] Appl. No.: 92,366

[22] Filed: Jul. 15, 1993

[30] Foreign Application Priority Data

Jul. 17, 1992 [JP] Japan .................................. 4-190398

[51] Int. Cl.[6] ........................ H03H 11/12; H01P 1/20; H01P 7/00

[52] U.S. Cl. .................................... 333/175; 333/202; 333/219.1; 330/109

[58] Field of Search ................................ 333/202-206, 333/219, 219.1, 235, 175; 331/96, 117 D; 330/56, 286, 109

[56] References Cited

U.S. PATENT DOCUMENTS

| | | | |
|---|---|---|---|
| 4,079,341 | 3/1978 | Linn et al. | 331/96 |
| 4,325,035 | 4/1982 | Nishikawa et al. | 331/96 |
| 4,816,788 | 3/1989 | Ishikawa et al. | 333/202 X |

FOREIGN PATENT DOCUMENTS

| | | | |
|---|---|---|---|
| 2652211 | 3/1991 | France | 333/219 |
| 2170668 | 2/1985 | United Kingdom . | |

OTHER PUBLICATIONS

Matsumura, H. et al., "An Active Microwave Filter with Dielectric Resonator", NHK Technical Research Laboratories, Tokyo, Japan, pp. 323-325, Apr. 30-May 2, 1979.

1979 IEEE MTT-S International Microwave Symposium-Digest; Apr. 30-May 2, 1979, Orlando; IEEE, New York, 1979 by H. Matsumura et al. entitled "An Active Microwave Filter with Dielectric Resonator," pp. 323-325.

IEE Proceedings-H., Microwaves, Antennas & Propagation, vol. 139, No. 2, Apr. 1992, Steenage GB, pp. 205-207 by B. Madrangeas et al. entitled "Three-pole Dielectric Resonators Microwave Bandpass Active Filter".

1990 IEEE MTT-S International Microwave Symposium-Digest, vol. 1, May 8-10, 1990, Dallas, U.S.; IEEE, New York, U.S. 1990 by X. H. Jiao et al., entitled "Microwave Frequency Agile Filters for MIC and MMIC Applications," pp. 503-505.

*Primary Examiner*—Seungsook Ham
*Attorney, Agent, or Firm*—Ostrolenk, Faber, Gerb & Soffen

[57] ABSTRACT

An active-type band pass filter achieves a compact structure and a minimum noise figure by setting a coupling Q factor ($Q_{e1}$) on an input side of an amplifier, a coupling Q factor ($Q_{e2}$) on an output side of the amplifier, and a gain G of the amplifier so that they satisfy the condition that $Q_{e1} < Q_{e2}$ and $1/Q_{e1} = G/Q_{e2}$. By increasing the term with the negative symbol in the equation $$\frac{1}{Q_0} = \frac{1}{Q_{00}} + \frac{1}{Q_{e1}} + \frac{1}{Q_{e2}} - \frac{2\sqrt{G}}{\sqrt{Q_{e1}Q_{e2}}}$$

the total no-load Q factor ($Q_o$) is set in the negative region.

6 Claims, 4 Drawing Sheets

ACTIVE-TYPE BAND-PASS FILTER

BACKGROUND OF THE INVENTION

1. Field of the Invention

The present invention relates to an active-type band-pass filter (referred to as "active-type BPF" hereinafter), and more particularly to an active-type BPF for use in a mobile communication system such as a portable telephone, mobile phone, and the like.

2. Description of the Prior Art

According to a conventional active-type BPF design, a no-load Q (Quality) factor of a practical resonator is around 1,000 in a transverse electromagnetic mode (referred to as "TEM mode" hereinafter), 6,000 in a transverse magnetic mode (referred to as "TM mode" hereinafter), and 20,000 in a transverse electric mode (referred to as "TE mode" hereinafter), where the no-load Q factors mentioned above are improved in the negative regions.

When a no-load Q factor of a resonator is designed to be, for example, five times greater than that of an original one, even if such a resonator is used as an active-type BPF, the resonator is accompanied by an excessively great noise figure (referred to as "NF" hereinafter). Therefore, it has been impossible to provide any practical active-type BPF.

The NF can be reduced when by increasing the no-load Q factor of the resonator. However, because the no-load Q factor of the resonator is approximately proportional to the size of the resonator, the resonator size is increased when the no-load Q factor of the resonator is increased. Thus, the resulting size of the resonator is too large to use the resonator as an active-type BPF.

SUMMARY OF THE INVENTION

Accordingly, an essential object of the present invention is to provide a compact active-type BPF having a reduced NF.

In order to achieve the object mentioned above, the present invention provides an active-type BPF which comprises an active feedback resonator including an amplifier, where a no-load Q factor of the active feedback resonator is set in a negative region.

According to a feature of the present invention, a ratio between a coupling intensity $Q_{e1}$ on the input side of the amplifier and an coupling intensity $Q_{e2}$ on the output side of the amplifier is made equal to a gain G of the amplifier to achieve a minimum noise temperature design. Furthermore, the total no-load Q factor of the active feedback resonator is set in the negative region by adjusting the values of the intensity $Q_{e1}$, $Q_{e2}$ and gain G, resulting in a reduced NF.

According to the present invention, since the NF can be reduced without increasing the no-load Q factor of the resonator, there can be obtained a compact and practical active-type BPF with a reduced NF.

BRIEF DESCRIPTION OF THE DRAWINGS

These and other objects, features and advantages of the present invention will become apparent from the following description taken in conjunction with the preferred embodiment thereof with reference to the accompanying drawings, in which.

DETAILED DESCRIPTION OF THE PREFERRED EMBODIMENTS

The following describes a preferred embodiment of the present invention with reference to the attached drawings.

Figure 1:
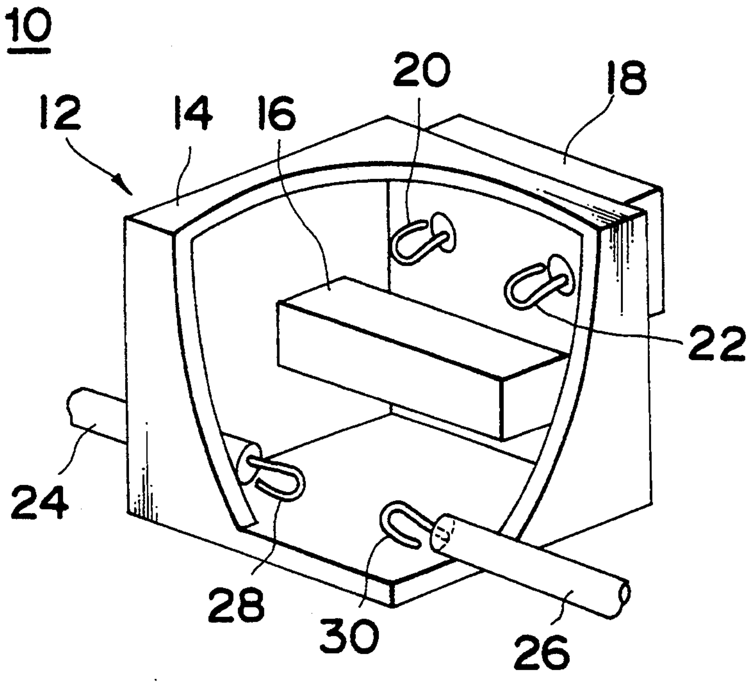
FIG. 1 is a perspective view of an embodiment of an active-type BPF in accordance with the present invention with a part thereof removed.
Figure 2:
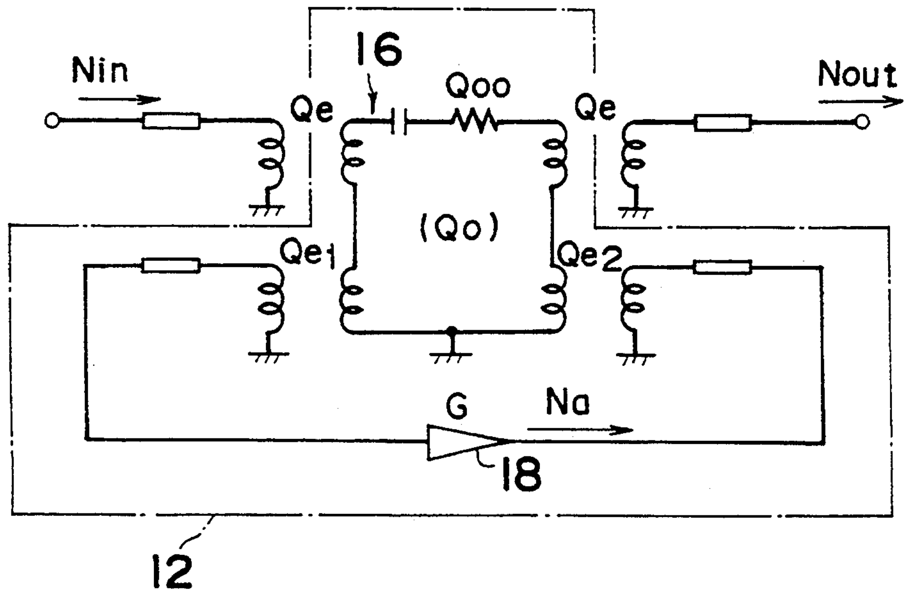
FIG. 2 is an equivalent circuit of the embodiment shown in FIG. 1.

Referring to FIGS. 1 and 2, an active-type BPF 10 of the present embodiment includes an active feedback resonator 12 having a housing 14 forming a cavity. In the cavity of the housing 14, there is provided a resonator 16 such as a TM single-mode resonator. To an external surface of the housing 14, there is mounted an amplifier 18 having its input and output loops 20 and 22 disposed in parallel within the housing 14. The amplifier 18 is magnetically coupled to the resonator 16 in a magnetic field by way of the amplifier input and output loops 20 and 22 located within the housing 14.

With the above-mentioned arrangement of the active feedback resonator 12, a part of the resonation electromagnetic field power of the resonator 16 is emitted through the input loop 20 and amplified by means of the amplifier 18. Then the resultant amplified power is fed back to the resonator 16 through the output loop 22.

The active feedback resonator 12 is further provided with an input port 24 and an output port 26 which are linearly mounted on respective opposing external surfaces of the housing 14. In more detail, the input port 24 and the output port 26 are inwardly passed through the housing 14 in such a manner that the input and output ports 24 and 26 are magnetically coupled to the resonator 16 in a magnetic field by way of magnetic field coupling loops 28 and 30 which are located within the housing 14.

The band-pass filter constructed by providing the input and output ports 24 and 26 in the active feedback resonator 12 is referred to as the active-type BPF 10.

An electric design of the active-type BPF 10 is determined by the following Equations 1 through 4, and a noise design is determined by the following Equation 5.

A relation expressed by the following Equation 6 allows the NF of the amplifier 18 to be determined from the noise power $N_a$ and the gain G of the amplifier 18.

Equation 1

$$|S_{21}|^2 = \left(\frac{2Q_L}{Q_e}\right)^2$$

Equation 2

$$\frac{1}{Q_L} = \frac{1}{Q_0} + \frac{2}{Q_e}$$

Equation 3

$$\frac{1}{Q_0} = \frac{1}{Q_{00}} + \frac{1}{Q_{e1}} + \frac{1}{Q_{e2}} - \frac{2\sqrt{G}}{\sqrt{Q_{e1}Q_{e2}}}$$

Equation 4

$$\frac{1}{Q_{e1}} = \frac{G}{Q_{e2}}$$

Equation 5

$$N_{out} = \frac{4Q_{L2}}{Q_eQ_{00}} N_0 + \frac{4Q_{L2}}{Q_eQ_{e2}} Na + \frac{4Q_{L2}}{Q_{e2}} N_{in}$$

Equation 6

$$NF = 10 \log\left(1 + \frac{N_a}{GN_0}\right)$$

By rearranging Equation 6, the noise power $N_a$ can be expressed by the following Equation 7.

Equation 7

$$N_a = GN_0\left(10^{\frac{NF}{10}} - 1\right)$$

The total NF of the active-type BPF 10 can be calculated according to the following Equation 8.

Equation 8

$$NF = 10 \log\left|\frac{N_{out}}{|S_{21}|^2 N_{in}}\right|$$

In Equations 1 through 8, $S_{21}$ denotes the gain at the center frequency after filtering, $Q_0$ the no-load Q factor of the active feedback resonator 12, $Q_{00}$ the original no-load Q factor of the resonator 16, $Q_e$ the coupling Q factor of the input/output port, $Q_{e1}$ the coupling Q factor on the input side of the amplifier external to the feedback loop, $Q_{e2}$ the coupling Q factor on the output side of the amplifier external to the feedback loop, $Q_L$ the load Q factor of the total circuit of the active feedback resonator, G the gain (power ratio) of the amplifier. $N_{in}$ the noise power at the input port, $N_{out}$ the noise power at the output port, $N_a$ the noise power on the output side of the amplifier, and $N_0$ the white-noise power.

Applying Equations 2 and 3 to the conventional BPF, the active feedback resonator is designed to have the no-load Q factor $Q_0$ in a range of $Q_0 > Q_{00}$. While in the embodiment of the present invention, the no-load Q factor $Q_0$ of the active feedback resonator is set in the negative range with the load Q factor $Q_L$ set within the positive range. For example, assuming that the active feedback resonator is designed to have $Q_e=400$ and $Q_0=-300$, the load Q factor Qn is determined to be 600 according to Equation 2.

The solution for satisfying both Equations 3 and 4 at the same time is given as following:

$$1/Q_{e1}=(1/Q_{00}-1/Q_0)\cdot G/(G-1)>G/(G-1)\cdot 1/Q_{00}$$

$$1/Q_{e2}-(1/Q_{00}-1/Q_0)\cdot 1/(G-1)>1/(G-1)\cdot 1/Q_{00}$$

when the no-load Q factor $Q_0$ is negative ($Q_0<0$). Accordingly, the following inequality is obtained:

$$Q_{e1}<Q_{00}\,(G-1)/G$$

$$Q_{e2}<Q_{00}\,(G-1)$$

For example, assuming that G=16 dB, i.e., 39.8 and $Q_{00}=1000$, the following range is obtained:

$$Q_{e1}<975$$

$$Q_{e2}<38800$$

The design of the present invention is possible as long as G exceeds 0dB (i.e., the power ratio must be greater than 1).

As to the white-noise power $N_0$ in Equation 5, the position of occurrence of the white-noise power $N_0$ in the equivalent circuit of FIG. 2 corresponds to the resistance portion of the no-load Q factor $Q_{00}$. The no-load Q factor $Q_{00}$ is calculated using the following circuit constants:

$$Q_{00}=\omega_0 L/R$$

where $\omega_0$ denotes a resonance frequency, L denotes a sum of inductances of the equivalent circuit of the resonator, and R denotes an internal resistance of the resonator which corresponds to $Q_{00}$. In this equation, the noise power generated by the resistance R is approximately represented by the following equation when the resistance R is substantially smaller than 50Ω:

$$N=(4R/Z_0)N_0$$

Accordingly, Equation 5 includes the term $N_o$.

As expressed by Equation 4 in connection with the design of the active-type BPF 10, the minimum noise temperature design is achieved when the coupling Q factor ($Q_{e1}$) on the input side of the amplifier 18 and the coupling Q factor ($Q_{e2}$) on the output side of the amplifier 18 have such a relation as $Q_{e1}<Q_{e2}$ provided that the ratio between $Q_{e1}$ and $Q_{e2}$ coincides with the gain G of the amplifier 18.

Figure 3:
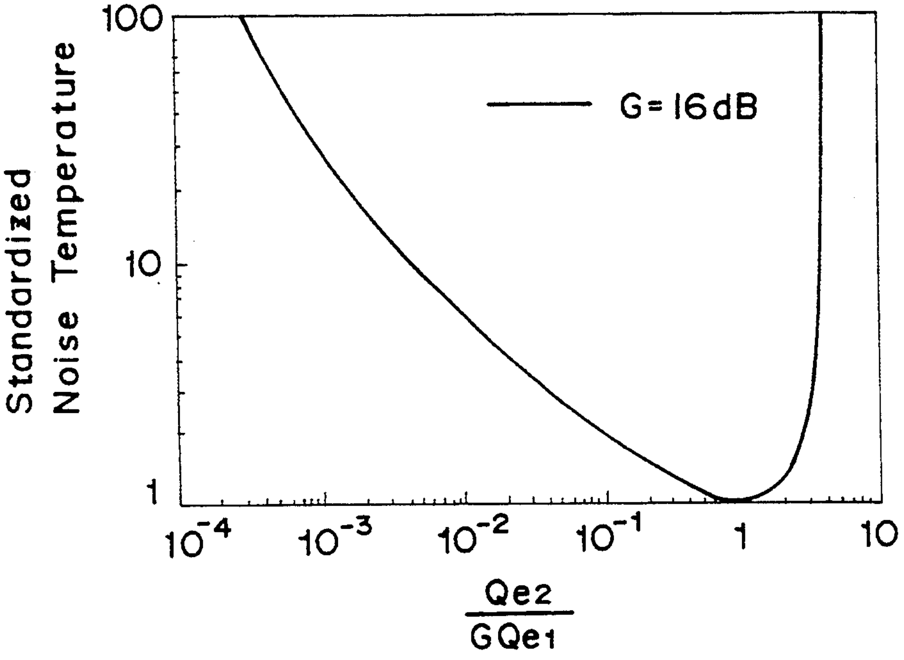
FIG. 3 is a graph showing a minimum noise print in designing an active-type BPF.

The above fact can be also apparent from FIG. 3. FIG. 3 shows a characteristic of a standardized noise temperature Θ with respect to $Q_{e2}/GQ_{e1}$, where the amplifier 18 has a gain G of 16 dB. The standardized noise temperature Θ is expressed by the following Equation 9.

Equation 9

$$\theta = \frac{1}{T_a}\left\{\left(\frac{Q_{00}}{Q_0 - Q_{00}}\right)T_n - \left(\frac{Q_0}{Q_0 - Q_{00}}\right)T_0\right\} = \frac{G}{Q_{e2}}\left(\frac{2\sqrt{G}}{\sqrt{Q_{e1}Q_{e2}}} - \frac{1}{Q_{e1}} - \frac{1}{Q_{e2}}\right)^{-1}$$

where $T_n$ denotes the noise temperature and $T_0$ denotes the white-noise temperature.

The noise temperature is defined such that a constant whitenoise power $N_0$ is generated from a standard resistor at a temperature of 290° K. In Equation 9, one of $Q_{e1}$ and $Q_{e2}$ can be obtained according to the electrical design of the active-type BPF, and the other can be obtained according to the design of the minimum noise temperature as expressed by Equation 4.

By making the value of the term with the negative symbol in the right member of Equation 3 greater than $(1/Q_{00}+1/Q_{e1}+1/Q_{e2})$, the no-load Q factor of the active feedback resonator 12 can be set in the negative region.

Figure 4:
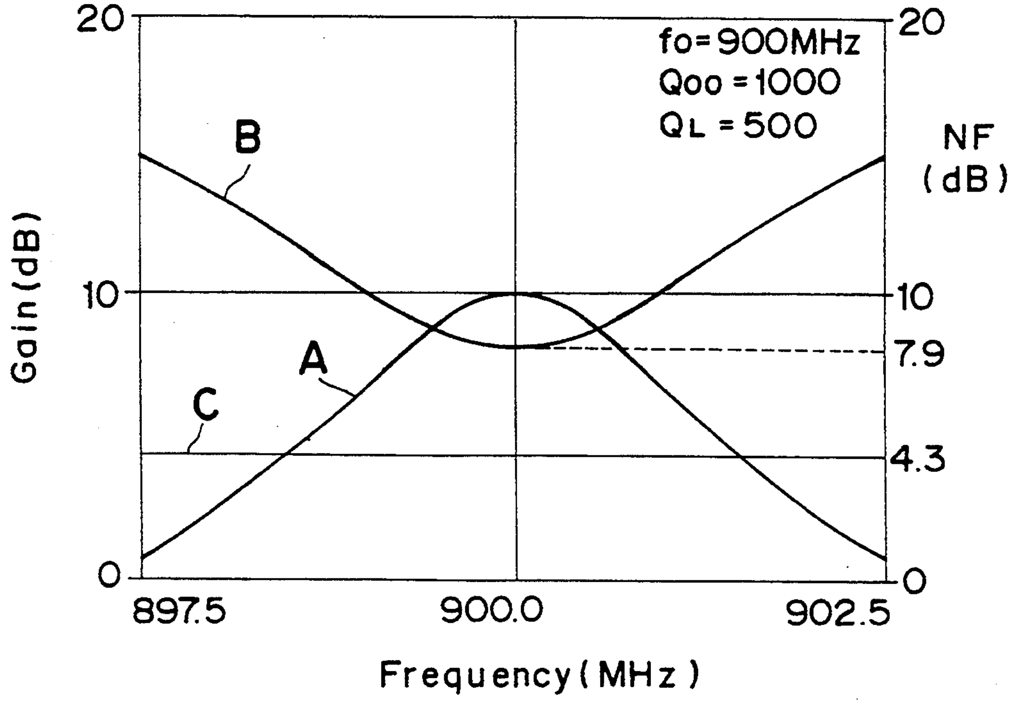
FIG. 4 is a graph showing a comparison between a NF characteristic of an active-type BPF and a NF characteristic of a conventional passive-type BPF when the BPFs have the same gain $S_{21}$.

According to the design conforming to Equations 3 and 4, the active-type BPF 10 has a gain $S_{21}$ which exceeds 0 dB level in the vicinity of the center frequency as indicated by the curve A in FIG. 4. That is, the power is amplified without attenuation in the band pass region to have the power ratio greater than 1.

FIG. 4 shows a comparison between an NF characteristic of an active-type BPF and an NF characteristic of a conventional passive-type BPF when the BPFs have the same gain $S_{21}$. The curve A in FIG. 4 indicates the frequency characteristic of the gain $S_{21}$ of the active-type BPF 10 and the curve B in FIG. 4 indicates the frequency characteristic of the gain $S_{21}$ of the passive-type BPF.

Figure 7:
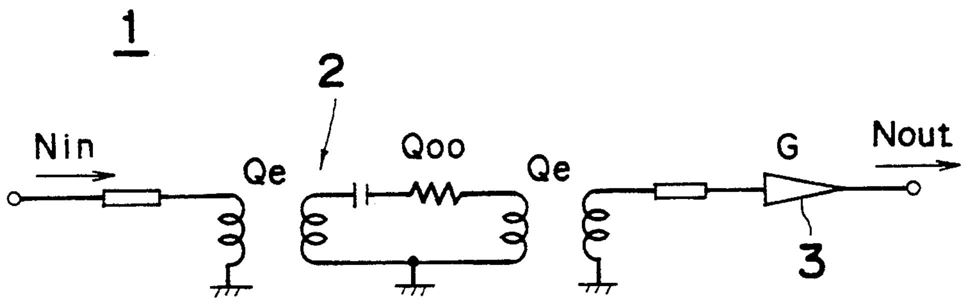
Fig. 7 (Prior Art)
FIG. 7 is an equivalent circuit of the conventional passive-type BPF.

The active-type BPF has not been put into practical use yet, and therefore a conventional passive-type BPF 1 as shown in FIG. 7 is used as a comparison example.

Referring to FIG. 7, a passive-type BPF 1 comprises a resonator 2 and an amplifier 3 which is coupled to the output side of the resonator 2 in a magnetic field. Similarly to FIG. 2, Q00 denotes a no-load Q factor of the resonator 2, $Q_e$ a coupling Q factor of the input/output port, G the gain (power ratio) of the amplifier 3, $N_{in}$ a noise power at the input port, $N_{out}$ a noise power at the output port.

The differences between the present embodiment and a conventional passive-type BPF is provided by describing the following design differences.

An amplifier 18 having a gain G of 16 dB and a noise figure $NF_{AMP}$ of 2.5 dB is used provided that the no-load Q factor ($Q_{00}$) of the resonator 16 is 1,000, the total load Q factor ($Q_L$) Of the circuit is 500, and the gain $S_{21}$ at the center frequency ($f_0$=900 MHz) obtained after filtering is +10 dB. It is noted that the gain $S_{21}$ of +10 dB is obtained by increasing the gain $S_{21}$ from −6 dB to the gain G of 16 dB of the amplifier 18, and the no-load Q factor ($Q_0$) of the active feedback resonator is set at −231 in the present embodiment.

With the above-mentioned arrangement, a total NF of 4.3 dB in the present embodiment (indicated by the line C in FIG. 4) can be achieved in the active-type BPF 10 as compared with the total NF of 7.9 dB (indicated by the curve B in FIG. 4) at the center frequency in the comparison example of the passive-type BPF 1. Therefore, in the present embodiment, the total NF can be improved by 3.6 dB. Furthermore, the NF of the active-type BPF 10 has almost no frequency dependence.

Figure 5:
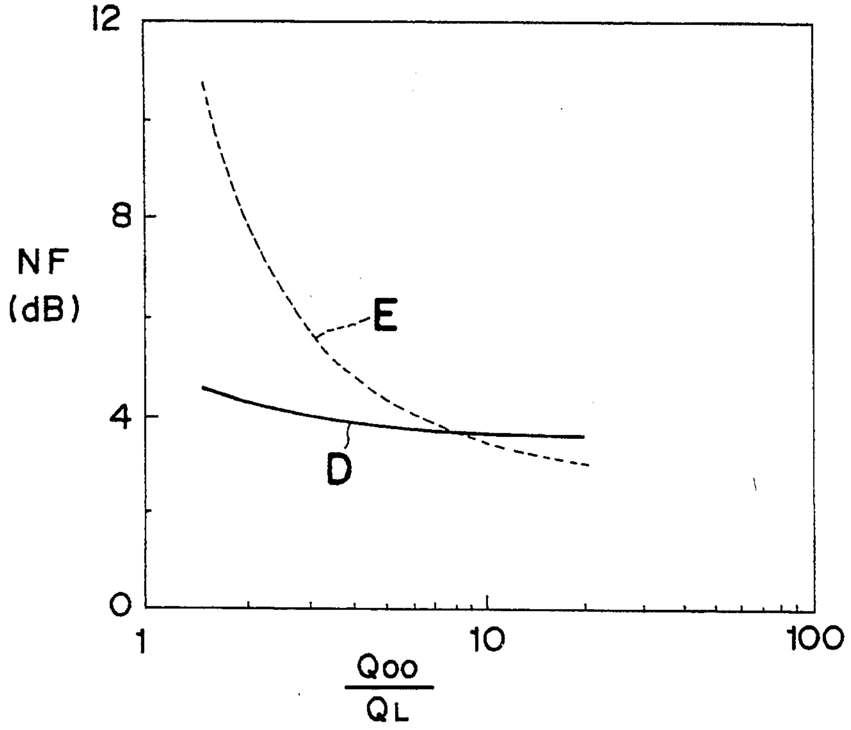
FIG. 5 is a graph showing a comparison between the NF characteristic of the active-type BPF and the NF characteristic of the passive-type BPF.

FIG. 5 shows the NF characteristics with respect to $Q_{00}/Q_L$, where the NF of the active-type BPF 10 of the present embodiment is indicated by the curve D. As is apparent from the graph, the total NF of the present embodiment is remarkably improved compared to the NF of the passive-type BPF indicated by the curve E.

Figure 6:
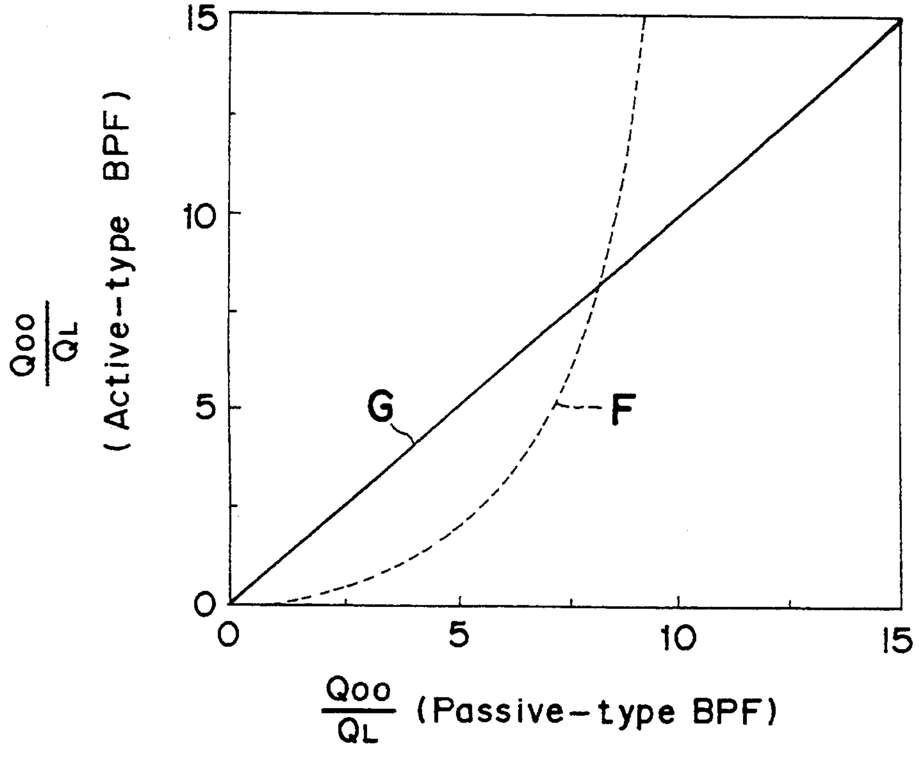
FIG. 6 is a graph showing a comparison between the no-load Q factor of the active-type BPF and the no-load Q factor of the conventional passive-type BPF when the BPFs have the same NF value.

As shown in FIG. 6, using a noise design having the NF of the active-type BPF 10 coincident with that of the passive-type BPF 1, the active-type BPF 10 is able to have a smaller $Q_{00}/Q_L$ value as indicated by the curve F. Therefore, a resonator 16 having a small no-load Q factor can be utilized. Assuming that the active-type BPF 10 is allowed to have a total NF of 7.86 dB, the resonator 16 is only required to have a no-load Q factor ($Q_{00}$) of 141. Therefore, if the active-type BPF 10 is allowed to have an NF on the current level, a resonator 16 having a small no-load Q factor, i.e., a compacted resonator 16, can be used.

A further compacting of the resonator can be achieved in the order of TE01δ mode resonator→TM mode resonator→TEM mode resonator→strip line filter. Thus, the overall size of the apparatus in which the compacted resonator is used can also be reduced.

The no-load Q factor of the resonator 16 can be reduced to approximately 1/7 in the above example of design setting, and therefore the single unit of the resonator 16 can be reduced in volume to approximately 1/25.

It is to be noted here that FIG. 5 indicates the fact that the NF can be improved in the region where the $Q_{00}/Q_L$ value is smaller than the value at the intersection of the active-type BPF 10 and the passive-type BPF 1 (i.e., intersection of the curve D and the curve E).

Further, FIG. 6 indicates the fact that the active-type BPF 10 can be compacted in the region where the $Q_{00}/Q_L$ value is smaller than the value at the intersection of the curve F and a reference line G. However, there is no problem since the practical $Q_{00}$ value is a small value.

As described above, in the present embodiment. the gain $S_{21}$ at the center frequency of the active-type BPF is increased from −6 dB to 10 dB by using the amplifier 18 having a gain G of 16 dB. However, in the active-type BPF 10, the gain $S_{21}$ at the center frequency can be increased from −6 dB to +10 dB by adjusting the coupling Q ($Q_e$) at the input/output port even when an amplifier 18 having a gain G different from 16 dB is used so long as the gain is greater than a specified value, and then the same characteristics as described hereinbefore can be obtained.

Although the present invention has been described in relation to particular embodiments thereof many other variations and modifications and other uses will become apparent to those skilled in the art. All such variations and modifications are considered to be within the spirit and scope of the claimed invention.

What is claimed is:

1. An active-type band-pass filter comprising:

a) an active feedback resonator and b an amplifier having an input side and an output side magnetically coupled to the active feedback resonator; wherein a no-load quality factor of said active feedback resonator is set in a negative region, said active-type band-pass filter satisfies the conditions that $Q_{e1} < -Q_{e2}$ and $1/Q_{e1} = G/Q_{e2}$, the intensity of coupling quality factor on the input side of the amplifier coupled to the active feedback resonator is $Q_{e1}$, the intensity of coupling quality factor on the output side of the amplifier coupled to the active feedback resonator is $Q_{e2}$, and the gain of the amplifier is G.

2. The active-type band-pass filter as claimed in claim 1, wherein said active feedback resonator has a housing in which there is provided an internal resonator and said amplifier is mounted on an external surface of the housing.

3. The active-type band-pass filter as claimed in claim 2, further comprising an amplifier input loop and an amplifier output loop disposed in parallel within the housing for coupling the amplifier to the internal resonator in a magnetic field, whereby said active feedback resonator emits a part of the resonation electromagnetic field power of the internal resonator through the input loop, and the power emitted through the input loop is amplified by said amplifier and fed back to the internal resonator through the output loop.

4. The active-type band-pass filter as claimed in claim 2, wherein said active feedback resonator is further provided with an input port having a magnetic field coupling loop and an output port having a magnetic field coupling loop, the magnetic field coupling loop of the input port being disposed opposite to the magnetic field coupling loop of the output port, wherein said input port and output port are disposed to pass from an exterior of the housing through a wall of the housing to an interior of the housing, the magnetic field coupling loops of the input port and the output port are disposed within the housing and couple the input port and the output port to the internal resonator in a magnetic field.

5. The active-type band-pass filter as claimed in claim 1, wherein the active feedback resonator comprises a feedback loop having an electric circuit design determined by the following equations:

$$|S_{21}|^2 = \left(\frac{2Q_L}{Q_e}\right)^2$$

$$\frac{1}{Q_L} = \frac{1}{Q_0} + \frac{2}{Q_e}$$

$$\frac{1}{Q_0} = \frac{1}{Q_{00}} + \frac{1}{Q_{e1}} + \frac{1}{Q_{e2}} - 2\frac{\sqrt{G}}{\sqrt{Q_{e1}Q_{e2}}}$$

$$\frac{1}{Q_{e1}} = \frac{G}{Q_{e2}}$$

and having a noise design determined by the following equation:

$$N_{out} = \frac{4Q_L2}{Q_eQ_{00}} N_0 + \frac{4Q_L2}{Q_eQ_e2} N_a + \frac{4Q_L2}{Q_e2} N_{in}$$

wherein $S_{21}$ represents a gain of the active-type band-pass filter measured at a center frequency after filtering after filtering, $Q_l$ represents a load quality factor of the circuit of the active feedback resonator, $Q_c$ represents a coupling quality factor of an input/output port of the active feedback resonator, $O_0$ represents a no-load quality factor of the active feedback resonator, $Q_{00}$ represents an original no-load quality factor of an internal resonator, $N_{out}$ represents noise power at an output port of the active feedback resonator, $N_0$ represents noise power of white noise, $N_a$ represents noise power at the output side of the amplifier and $N_{in}$ represents noise power at an input port of the active feedback resonator.

6. The active-type band-pass filter as claimed in claim 5, wherein the no-load quality factor of said active feedback resonator is set in the negative region by increasing the value of $$2\frac{\sqrt{G}}{\sqrt{Q_{e1}Q_{e2}}}.$$

* * * * *